United States Patent
Newsome et al.

(10) Patent No.: US 10,249,822 B2
(45) Date of Patent: Apr. 2, 2019

(54) POLYMER BLENDS FOR A SEMICONDUCTING LAYER OF AN ORGANIC ELECTRONIC DEVICE

(71) Applicants: Cambridge Display Technology Limited, Godmanchester (GB); Sumitomo Chemical Company Limited, Tokyo (JP)

(72) Inventors: Christopher Newsome, St. Ives (GB); Shuji Doi, Ibaraki (JP)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 0 days.

(21) Appl. No.: 15/557,883

(22) PCT Filed: Mar. 1, 2016

(86) PCT No.: PCT/EP2016/054335
§ 371 (c)(1),
(2) Date: Sep. 13, 2017

(87) PCT Pub. No.: WO2016/146378
PCT Pub. Date: Sep. 22, 2016

(65) Prior Publication Data
US 2018/0053897 A1    Feb. 22, 2018

(30) Foreign Application Priority Data

Mar. 13, 2015    (GB) .................................. 1504266.6

(51) Int. Cl.
*H01B 1/00*    (2006.01)
*H01L 51/00*    (2006.01)
*H01L 51/05*    (2006.01)

(52) U.S. Cl.
CPC ...... *H01L 51/0039* (2013.01); *H01L 51/0036* (2013.01); *H01L 51/0043* (2013.01);
(Continued)

(58) Field of Classification Search
CPC ............. H01L 21/0039; H01L 51/0036; H01L 51/0043; H01L 51/0558
See application file for complete search history.

(56) References Cited

U.S. PATENT DOCUMENTS

| 7,718,734 | B2 | 5/2010 | Veres et al. |
| 2006/0155040 | A1* | 7/2006 | Veres .................. H01L 51/0035 524/484 |

(Continued)

FOREIGN PATENT DOCUMENTS

| EP | 1 810 986 A2 | 7/2007 |
| EP | 1 810 986 A3 | 7/2009 |

(Continued)

OTHER PUBLICATIONS

International Search Report and Written Opinion for International Application No. PCT/EP2016/054335, dated May 6, 2016.

(Continued)

*Primary Examiner* — Julio J Maldonado
*Assistant Examiner* — Andre C. Stevenson
(74) *Attorney, Agent, or Firm* — Wolf, Greenfield & Sacks, P.C.

(57) ABSTRACT

Provided is a polymer blend for a semiconducting layer of an organic electronic device, comprising: a first polymer; a second polymer which is different from the first polymer; and a semiconductor compound selected from the group of pentacene derivatives and thiophene derivatives. The semiconductor compound is distributed homogeneously in the semiconducting layer in the direction parallel to the surface of the electrodes. This improved lateral distribution of the (Continued)

semiconductor compound in the semiconducting layer provides a reduced contact resistance, particularly for short channel length devices.

12 Claims, 5 Drawing Sheets

(52) U.S. Cl.
CPC ...... *H01L 51/0074* (2013.01); *H01L 51/0558* (2013.01); *H01L 51/0003* (2013.01)

(56) References Cited

U.S. PATENT DOCUMENTS

| | | | |
|---|---|---|---|
| 2011/0226999 A1* | 9/2011 | Tierney | C08G 61/12 252/500 |
| 2011/0257277 A1 | 10/2011 | Elschner et al. | |
| 2014/0225101 A1* | 8/2014 | Burroughes | H01L 51/0074 257/40 |

FOREIGN PATENT DOCUMENTS

| WO | WO 2004/094501 A3 | 11/2004 |
|---|---|---|
| WO | WO 2013/182264 A1 | 12/2013 |
| WO | WO 2014/053206 A1 | 4/2014 |
| WO | WO 2014/140568 A1 | 9/2014 |

OTHER PUBLICATIONS

Combined Search and Examination Report for British Application No. 1504266.6, dated Oct. 15, 2015.

\* cited by examiner

POLYMER BLENDS FOR A SEMICONDUCTING LAYER OF AN ORGANIC ELECTRONIC DEVICE

RELATED APPLICATIONS

This application is a national stage filing under 35 U.S.C. § 371 of international PCT application, PCT/EP2016/054335, filed Mar. 1, 2016, which claims priority to United Kingdom patent application, GB 1504266.6, filed Mar. 13, 2015, each of which is incorporated herein by reference in its entirety.

FIELD OF THE INVENTION

The present invention relates to a polymer blend for a semiconducting layer of an organic electronic device, in particular a thin film transistor which comprises a semiconducting layer comprising said blend.

BACKGROUND

Organic electronic devices include organic light emitting diodes (OLEDs), photovoltaic cells, capacitors, organic field-effect transistors and the like. Transistors may for example be formed by processes wherein their semiconducting layer, and in many cases, other layers, is deposited from solution. The resulting transistors are called thin-film transistors. When an organic semiconductor is used in the semiconducting layer, the device is often described as an organic thin film transistor (OTFT).

Various arrangements for OTFTs are known. One device, an insulated gate-field effect transistor, comprises source and drain electrodes with a semiconducting layer disposed therebetween in a channel region, a gate electrode disposed over the semiconducting layer and a layer of insulating material disposed between the gate electrode and the semiconductor in the channel region.

The conductivity of the channel can be altered by the application of a voltage at the gate. In this way the transistor can be switched on and off using an applied gate voltage. The drain current that is achievable for a given voltage is dependent on the mobility of the charge carriers in the organic semiconductor in the active region of the transistor, namely the channel region between the source and drain electrodes. Thus in order to achieve high drain currents with low operational voltages, organic thin film transistors must have an organic semiconducting layer which has highly mobile charge carriers in the channel region.

High mobility OTFTs containing small molecule organic semiconductors have been reported and the high mobility has been attributed, at least in part, to the highly crystalline nature of the semiconductor. Particularly high mobilities have been reported in single crystal OTFTs wherein the organic semiconductor is deposited by thermal evaporation (see, for example, Podzorov et al, Appl. Phys. Lett., 2003, 83(17), 3504-3506).

Unfortunately, however, it can be difficult to obtain repeatable results from solution processed films of small molecule semiconductors. This is believed to be due to their poor film forming properties. Issues with material reticulation from and adhesion to substrates, film roughness and film thickness variations can limit the performance of small molecule semiconductors in OTFTs. Film roughness can be a further problem for top gate organic thin film transistors as the accumulation layer is formed at the uppermost surface of the semiconducting layer.

To overcome these problems, the use of blends of small molecule semiconductor and polymers, especially polymeric semiconductors, has been developed. The motivation for using such blends is primarily to overcome the poor film forming properties of the small molecule semiconductors. Blends exhibit superior film forming properties due to the film forming properties of the polymer. Numerous examples of small molecule semiconductor and polymeric semiconductor blends can be found in the literature.

Blends of small molecule semiconductor and polymeric semiconductor may be solution processed, e.g. by spin coating or ink jet printing, to form a semiconducting layer. Generally the process involves dissolving the semiconductors in a solvent, spin coating or ink jet printing the solution onto a substrate and then drying the resulting wet film. During the drying step, the solvent evaporates to yield the semiconducting layer comprising a matrix of polymer semiconductor comprising crystals of small molecule semiconductor.

Most of the prior art relating to small molecule and polymeric semiconductor blends have focussed on selection of certain semiconductors and their ratios in the blend in order to optimise the field effect mobility.

U.S. Pat. No. 7,718,734 relates to compositions for use as organic semiconducting materials, said composition comprising at least one higher molecular weight organic semiconducting compound having a number average molecular weight of at least 5,000, and at least one lower molecular weight organic semiconducting compound having a number average molecular weight of 1,000 or less.

SUMMARY OF INVENTION

The present invention provides:
(1) a polymer blend for a semiconducting layer of an organic electronic device, comprising:
   a first polymer;
   a second polymer which is different from the first polymer; and
   a semiconductor compound selected from the group of pentacene derivatives and thiophene derivatives.
(2) an organic electronic device comprising:
   i) a substrate;
   ii) source and drain electrodes deposited on said substrate and having a channel region located in between them;
   iii) a semiconducting layer comprising the blend of (1) deposited over at least a portion of said source and drain electrodes and in said channel region;
   iv) an insulating layer deposited over said semiconducting layer; and
   v) a gate electrode deposited on said insulating layer.
(3) an organic electronic device comprising:
   i) a substrate;
   ii) a gate electrode deposited on said substrate;
   iii) an insulating layer deposited over said gate electrode;
   iv) source and drain electrodes deposited on said insulating layer and having a channel region located in between them;
   v) a semiconducting layer comprising the blend of (1) deposited over at least a portion of said source and drain electrodes and in said channel region.

Preferred embodiments are set forth in the subclaims and the following detailed description.

DEFINITIONS

As used herein the term "semiconductor" refers to a compound that can act as either an electrical conductor or insulator depending upon the voltage applied to it. The term "semiconducting layer" refers to a continuous film of material that is semiconducting. The semiconducting layer formed in the present invention comprises a mixture or blend of at least two different polymers and a semiconductor compound. Preferably the at least two different polymers form a matrix in which the semiconductor compound is dispersed.

As used herein the term "semiconductor compound" refers to small molecule compounds that are semiconductors. The term includes dendrimeric and oligomeric compounds (e.g. dimers, trimers, tetramers and pentamers) that have a polydispersity of 1. The semiconductor compounds are non-polymeric compounds. Preferred non-polymeric semiconductor compounds are crystalline.

As used herein the term "lateral distribution" refers to a distribution of semiconductor crystals which extend substantially the entire length of the channel between the source and the drain electrodes as well as over the source and drain electrodes, in a direction parallel to the surface of the electrodes.

As used herein the term "alkyl" refers to saturated, straight chained, branched or cyclic groups. Alkyl groups may be substituted or unsubstituted.

As used herein the term "alkenyl" refers to unsaturated straight chained, branched or cyclic groups. Alkenyl groups may be substituted or unsubstituted.

As used herein the term "alkoxy" refers to O-alkyl groups, wherein alkyl is as defined above.

As used herein the term "amino" refers to primary (i.e. $NH_2$), secondary (NHR) and tertiary amino groups ($NR_2$) wherein R is alkyl as defined above.

As used herein the term "halogen" encompasses atoms selected from the group consisting of F, Cl, Br and I.

As used herein the term "silyl" refers to groups of the formulae -A-SiR'R"R''' wherein A is optionally present and is a saturated or unsaturated group selected from $C_{1-8}$ alkylene, $C_{1-8}$ alkenylene or $C_{1-8}$ alkynylene and each of R', R" and R''' is H or alkyl as defined above.

As used herein the term "stannyl" refers to groups of the formulae —Sn(R')$_r$ wherein r is 1, 2 or 3 and each R' is H or alkyl as defined above.

As used herein the term "amido" refers to groups of the formulae —NHCOR and —NRCOR wherein each R, which may the same or different, is alkyl as defined above.

As used herein the term "aryl" includes single and multiple ring compounds, including multiple ring compounds that contain separate or fused rings. As used herein the term "heteroaryl" refers to aryl groups comprising a heteroatom selected from N, O and S. An example of an aryl group is phenyl, i.e. $C_6H_5$. Phenyl groups may be substituted or unsubstituted. An example of a heteroaryl group is thiophene, i.e. $C_4H_4S$. It may be substituted or unsubstituted. A further example is benzothiophene, which has the following structure. It may also be substituted or unsubstituted.

DESCRIPTION OF THE INVENTION

The present invention provides a polymer blend for a semiconducting layer of an organic electronic device, comprising:
  a first polymer;
  a second polymer which is different from the first polymer; and
  a semiconductor compound selected from the group of pentacene derivatives and thiophene derivatives.

The polymer blend of the present invention comprises a mix of at least two different polymers and a semiconductor compound which is a pentacene derivative or thiophene derivative. When used in organic electronic devices such as thin film transistors, the field effect mobility of the semiconductor layer can be greatly enhanced. In addition, the bias stress stability is also improved, which illustrates that the threshold voltage stability as well as the output current stability can be improved when using the polymer blend of the present invention. The semiconductor compound which is a pentacene derivative or thiophene derivative is a non-polymeric compound which has a different chemical structure from that of the monomers or oligomers derived from the polymers in the polymer blend. In other words, the semiconductor compound does not comprise any unreacted monomers left over from the polymerization of the polymers comprising the blend.

The polymer blend may be used as a high mobility semiconducting material in various organic electronic devices and apparatuses, for example in the form of a semiconducting layer or film. The polymer blend may preferably be used for a layer or film in a field effect transistor, e.g. as the semiconducting channel, or as a hole or electron injection or transport layer in an organic light emitting device.

Preferably, the first polymer comprises amino functional groups. Also preferred is the first polymer being a polyfluorene derivative. Even more preferred is the first polymer comprising the amino functional groups in the main chain of the polymer.

Most preferably, the first polymer of the blend is of the following formula:

(I)

wherein R¹ and R² are the same or different and each is independently selected from the group consisting of hydrogen and a linear, branched or cyclic alkyl group having from 1 to 16 carbon atoms, and wherein n is an integer of 30 or more.

Examples of alkyl groups include methyl, ethyl, propyl, butyl, pentyl, hexyl, heptyl, octyl, nonyl or decyl, as well as ethylhexyl. Especially preferred are hexyl or heptyl. It is further preferred that R¹ and R² are the same.

Preferably, the second polymer is a polythiophene derivative. More preferably, the second polymer is an indacenodithiophene polymer. Even more preferred is the second polymer being a copolymer of indacenodithiophene and benzothiadiazole.

The second polymer is preferably a copolymer of benzothiadiazole and the repeat unit (1)

Where A and B represent aromatic or heteroaromatic (benzene, thiophene, benzothiophene, thienothiophene, etc.) C represent aromatic or heteroaromatic (benzene, naphtharene, benzothiophene, thienothiophene, etc.)

Most preferably, the second polymer is of the following formula:

(II)

wherein R³, R⁴, R⁵ and R⁶ are the same or different and each is independently selected from the group consisting of hydrogen and a linear, branched or cyclic alkyl group having from 1 to 16 carbon atoms, and wherein m is an integer of 30 or more.

Examples of alkyl groups include methyl, ethyl, propyl, butyl, pentyl, hexyl, heptyl, octyl, nonyl or decyl, as well as ethylhexyl. It is further preferred that $R^3$, $R^4$, $R^5$ and $R^6$ are the same.

The semiconductor compound of the present invention is a non-polymeric semiconductor compound. The semiconductor compound may be any small molecule semiconductor compound suitable for the purpose, e.g. those known to the skilled person skilled as described in the prior such as those small molecule semiconductors described in WO2010/061176. Suitable non-polymeric semiconductors are commercially available. Typical examples include pentacene derivatives and thiophene derivatives. Preferred are thiophene derivatives, especially fused thiophene derivatives.

Preferably the semiconductor compound is a compound comprising a core of at least three fused rings wherein each ring is independently selected from aromatic rings and heteroaromatic rings that are each individually unsubstituted or substituted with one or more substituents. Exemplary substituents include $C_{1-12}$ alkyl groups, $C_{1-12}$ alkoxy groups, halogens (e.g. F), or silyl groups including trialkylsilyl and trialkylsilylethynyl.

Preferably the non-polymeric semiconductor is a benzothiophene derivative and more preferably a benzothiophene derivative of the following formula:

(III)

wherein A is a phenyl group or a thiophene group, said phenyl group or thiophene group optionally being fused with a phenyl group or a thiophene group which can be unsubstituted or substituted with at least one group of formula $X^1$ and/or fused with a group selected from a phenyl group, a thiophene group and a benzothiophene group, any of said phenyl, thiophene and benzothiphene groups being unsubstituted or substituted with at least one group of formula $X^1$; and each group $X^1$ may be the same or different and is selected from the group consisting of (i) unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups, unsubstituted or substituted alkenyl groups having from 2 to 12 carbon atoms and unsubstituted or substituted alkynyl groups having from 2 to 12 carbon atoms, or (ii) a polymerisable or reactive group selected from the group consisting of halogens, boronic acids, diboronic acids and esters of boronic acids and diboronic acids, alkenyl groups having from 2 to 12 carbon atoms and stannyl groups.

Examples of alkyl groups include methyl, ethyl, propyl, butyl, pentyl, hexyl, heptyl, octyl, nonyl or decyl. Examples of alkoxy groups include methoxy, ethoxy, propoxy, isopropoxy and butoxy. Examples of amino groups include amino, methylamino, ethylamino and methylethylamino. Examples of silyl groups include trialkylsilyl and trialkylsilylethynyl. Examples of alkenyl groups include ethenyl, propenyl and 2-methylpropenyl.

Possible substituents on the afore-mentioned $X^1$ groups include alkoxy groups having from 1 to 12 carbon atoms, halogen atoms, amino groups that may be unsubstituted or substituted with one or two alkyl groups that may be the same or different and each having from 1 to 8 carbon atoms, acylamino groups having from 2 to 12 carbon atoms, nitro groups, alkoxycarbonyl groups having from 2 to 7 carbon atoms, carboxyl groups, aryl groups having from 5 to 14 carbon atoms and 5- to 7-membered heteroaryl groups containing from 1 to 3 sulfur atoms, oxygen atoms, selenium atoms and/or nitrogen atoms.

Examples of more preferred non-polymeric semiconductors are shown below:

wherein $X^1$ is as defined above in relation to formulae (III).

Most preferably, the semiconductor compound is of the following formula:

wherein $R^7$ and $R^8$ are the same or different and each is independently selected from the group consisting of hydrogen and a linear, branched or cyclic alkyl group having from 1 to 16 carbon atoms.

Examples of preferred alkyl groups for $R^7$ and $R^8$ are selected from the group consisting of methyl, ethyl, propyl, butyl, pentyl, hexyl, heptyl, octyl, nonyl or decyl. More preferred is $R^7$ and $R^8$ being hexyl, or heptyl. It is further preferred that $R^7$ and $R^8$ are the same.

The present invention also provides an organic electronic device comprising:
i) a substrate;
ii) source and drain electrodes deposited on said substrate and having a channel region located in between them;
iii) a semiconducting layer comprising the blend of the present invention deposited over at least a portion of said source and drain electrodes and in said channel region;
iv) an insulating layer deposited over said semiconducting layer; and
v) a gate electrode deposited on said insulating layer.

The present invention further provides an organic electronic device comprising:
i) a substrate;
ii) a gate electrode deposited on said substrate;
iii) an insulating layer deposited over said gate electrode;
iv) source and drain electrodes deposited on said insulating layer and having a channel region located in between them;
v) a semiconducting layer comprising the blend of the present invention deposited over at least a portion of said source and drain electrodes and in said channel region.

Deposition of the semiconducting layer of the organic device comprising the blend of the present invention is carried out from a solution. Any conventional solution-based processing method may be used. Representative examples of solution-based processing methods include spin coating, dip coating, slot die coating, doctor blade coating and ink-jet printing. In preferred methods of the invention, however, depositing is carried out by spin coating. The parameters used for spin coating the semiconductor film such as spin coating speed, acceleration and time are selected on the basis of the target thickness for the semiconducting layer. Typical target thicknesses are in the range of 20 to 60 nm. Preferably the spin coating is carried out in a single phase spin. Preferably the spin speed is 300 to 1000 rpm, more preferably 400 to 900 rpm and still more preferably 500 to 750 rpm. Preferably the spin time is 5 to 180 seconds, more preferably 10 to 60 seconds and still more preferably 20 to 40 seconds. Preferably the acceleration time from rest is less than 3 seconds, preferably less than 2 seconds and still more preferably less than 1 second. Any conventional spin coating apparatus may be used. The apparatus is used in a conventional manner.

The solvents present in the solution or blend for deposition may be any suitable solvent or blend of solvents. Preferred are aromatic solvents. Suitable aromatic solvents are commercially available from a range of suppliers. Anhydrous grade solvents are typically selected. Such solvents are generally able to form solutions of both polymeric and non-polymeric semiconductors. Typical solvents include, but are not limited to, xylene, anisole derivatives, such as for example 4-methyl anisole, tetralin, cyclohexylbenzene (CHB), decalin, toluene, tetramethylbenzene, etc. One preferred solvent system comprises a mixture comprising a) at least one of 4-methyl anisole, indane and an alkylbenzene with a linear or branched alkyl group containing from 4 to 7 carbon atoms; and b) at least one of tetrahydronaphthalin and 1,2,4-trimethylbenzene.

The solution has a typical total solids content of between 4 and 15 mg per 1 ml solvent.

The blend of the present invention is particularly advantageous when the semiconducting layer is deposited over source and drain electrodes that have been pre-treated with a surface modifying compound, such as a fluorinated benzenethiol. Such pre-treatments are carried out to reduce the contact resistance of the devices through an increase in the work function of the metal contact.

Preferably the weight ratio of the first and second polymers to the semiconductor compound in the semiconducting layer is in the range 60:40 to 90:10, more preferably 70:30 to 85:15 and still more preferably about 75:25. The solution or blend for deposition preferably comprises 0.5 to 10% wt/v semiconductor, still more preferably 0.6 to 7.5% wt/v semiconductor and yet more preferably 1 to 5% wt/v semiconductor.

The weight ratio of the first to second polymer is typically from 10:1, preferably 5:1 to 1:5, more preferably 3:1 to 1:3, such as about 1:1 or 2:1. In a preferred embodiment, the weight proportion of the first polymer is higher than the weight proportion of the second polymer.

In preferred embodiments of the invention at least a part of one surface, more preferably at least one surface, of each of the electrodes of the organic electronic device is coated with a surface-modifying compound. Preferred surface-modifying compounds form a self-assembled monolayer (SAM). The surface modifying compound preferably reduces contact resistance between the semiconductors and the electrodes by altering the work function of the source and drain electrodes.

Preferably the surface-modifying material is of formula (V)

Bind-(Sp)$_z$-Org    (V)

wherein
Bind is a binding group, preferably a thiol;
Sp is a spacer group, preferably a $C_{1-12}$ alkyl or $C_{6-10}$ aryl group;
z is 0 or 1, preferably 0; and
Org is a conjugated organic group, preferably phenyl substituted by one or more fluorine atoms.

The surface-modifying compound is preferably a fluorinated benzenethiol. Representative examples of suitable compounds include pentafluorobenzenethiol. The surface-modifying compound may be applied to the electrodes using any conventional method known in the art.

The present invention provides polymer blends for semiconducting layers which have a high charge carrier mobility. The semiconducting layer of the organic preferably has a thickness of 20 to 80 nm, more preferably 30 to 60 nm, and even more preferably of 40 to 50 nm.

The semiconducting layer may be incorporated into any organic electronic device that benefits from improved mobility. Preferably, however, the organic electronic device is an organic thin film transistor. The transistors can be p-type or n-type. Suitable transistor configurations include top-gate transistors and bottom-gate transistors.

In one preferred embodiment the organic electronic device is a top gate transistor. In this case the source and drain electrodes having a channel region located in between them are preferably deposited on a substrate, and the semiconducting layer is deposited over at least a portion of the source and drain electrodes and in said channel region. Preferably at least a part of one surface, more preferably at least one surface, of each of the electrodes is pre-coated with a surface-modifying compound. Preferably the device further comprises an insulating layer on the surface of the semiconducting layer. Still more preferably the device further comprises a gate electrode on the insulating layer.

In another preferred embodiment the organic electronic device is a bottom gate transistor. In this case the source and drain electrodes having a channel region located in between them are deposited on a substrate on which a gate electrode and an insulating layer have already been deposited, and the semiconducting layer is deposited over at least a portion of the source and drain electrodes and in the channel region. Preferably at least a part of at least one surface, more preferably at least one surface, of each of the electrodes is coated with a surface-modifying compound as described above.

Figure 1:
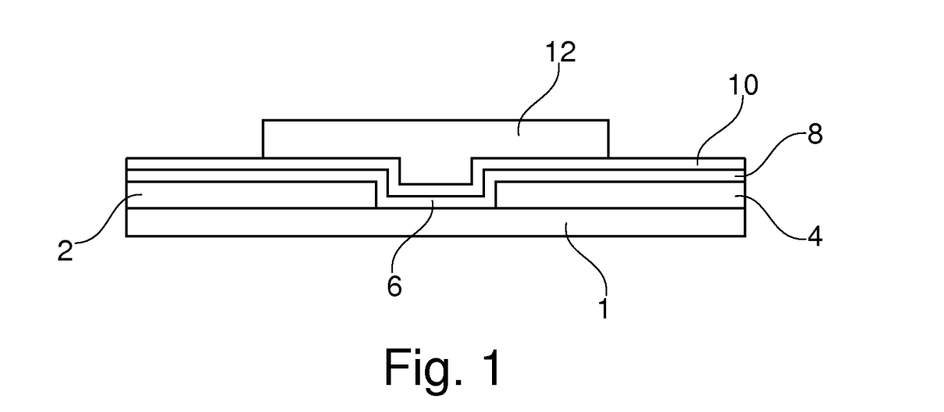
FIG. 1 is a schematic of a typical top gate thin film transistor.

Referring to FIG. 1, a schematic of a top gate thin film transistor is illustrated. The structure may be deposited on a substrate 1 and comprises source and drain electrodes 2, 4 which are spaced apart with a channel region 6 located therebetween. An organic semiconductor 8 is deposited in the channel region 6 and may extend over at least a portion of the source and drain electrodes 2, 4. An insulating layer 10 of dielectric material is deposited over the organic semiconductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

Figure 2:
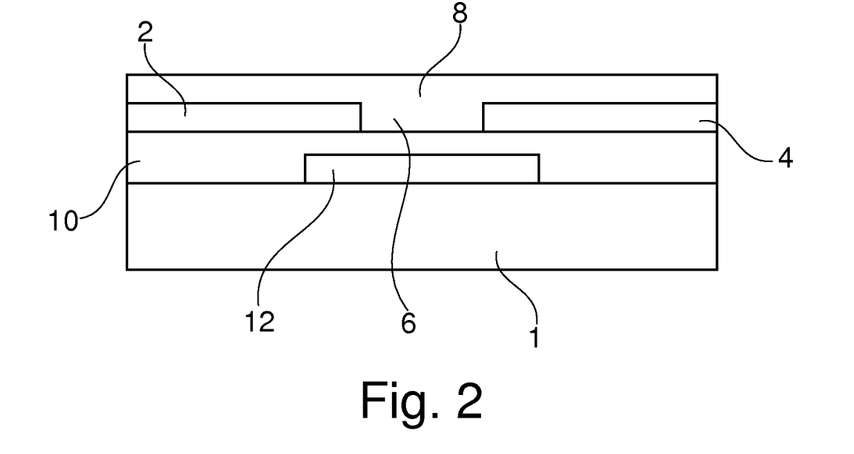
FIG. 2 is a schematic of a typical bottom gate thin film transistor.

FIG. 2 shows a schematic of a bottom gate thin film transistor. In FIG. 2 like reference numerals have been used for corresponding parts to FIG. 1. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor 8 is deposited in the channel region 6 and may extend over at least a portion of the source and drain electrodes 2, 4.

The conductivity of the channel of the transistors can be altered by the application of a voltage at the gate. In this way the transistor can be switched on and off using an applied gate voltage. The drain current that is achievable for a given voltage is dependent on the mobility of the charge carriers in the channel region between the source and drain electrodes. Thus, in order to achieve high drain currents with low operational voltages, organic thin film transistors must have an organic semiconductor which has highly mobile charge carriers in the channel region.

The electrodes (source, drain and gate) are preferably 20 to 300 nm thick and more preferably 40 to 250 nm. The insulating layer is preferably 10 to 2000 nm thick and more preferably 300 to 400 nm.

The substrate may be any material conventionally used in the art such as glass or plastic (e.g. of PEN, PET or polycarbonate type). Optionally the substrate is pre-treated to improve adhesion thereto. Preferred is a PEN substrate- The source, drain and gate electrodes may be selected from a wide range of conducting materials. Representative examples include a metal (e.g. chromium, titanium, gold, aluminium, silver, copper, nickel), a metal alloy, a metal compound (e.g. indium tin oxide) or a conductive polymer. Preferably the source, drain and gate electrodes are metal. More preferably the source and drain electrodes are Cr/Au. More preferably the gate electrode is Al.

The insulating layer is preferably a dielectric. Any conventional dielectric may be used. Representative examples of suitable dielectrics include polytetrafluoroethylene (PTFE), perfluoro cyclo oxyaliphatic polymer (CYTOP), perfluoroalkoxy polymer resin (PFA), fluorinated ethylene-propylene (FEP), polyethylenetetrafluoroethylene (ETFE), polyvinylfluoride (PVF), polyethylenechlorotrifluoroethylene (ECTFE), polyvinylidene fluoride (PVDF), polychlorotrifluoroethylene (PCTFE), perfluoro elastomers (FFKM) such as Kalrez® or Tecnoflon®, fluoro elastomers such as Viton®, perfluoropolyether (PFPE) and a polymer of tetrafluoroethylene, hexafluoropropylene and vinylidene fluoride (THV). Fluorinated polymers are an attractive choice for the dielectric, particularly in the field of organic thin film transistors (OTFTs), because they possess a number of favourable properties including: (i) excellent spin coating properties, for instance: (a) wetting on a wide variety of surfaces; and (b) film formation, with the option of doing multi-layer coatings; (ii) chemical inertness; (iii) quasi-total solvent orthogonality: consequently, the risk of the organic semiconductor being dissolved by the solvent used for spin-coating the dielectric is minimal; and (iv) high hydrophobicity: this can be advantageous because it results in low water uptake and low mobility of ionic contaminants in the fluorinated polymer dielectric (low hysteresis).

Preferred devices of the present invention have one or more of the following structural characteristics:
Substrate: PEN substrate
Source and drain electrodes: Gold
Source and drain electrode thickness: 5 to 200 nm
Electrode SAM: pentafluorobenzenethiol
SAM thickness: less than 10 nm
Channel length: less than 20 microns
Semiconducting layer thickness: 20 to 100 nm
Insulating layer: PTFE
Insulating layer thickness: 50 to 500 nm
Gate electrode: Aluminium
Gate electrode thickness: 20 to 300 nm The organic devices of the present invention advantageously comprise a semiconducting layer wherein the semiconductor compound is distributed homogeneously in the semiconducting layer in the direction parallel to the surface of the electrodes.

The improved lateral distribution of the semiconductor compound in the semiconducting layer manifests itself in reduced contact resistance, particularly for short channel length devices (<20 μm). In short channel length devices contact resistance can contribute a significant proportion to the total channel resistance in the device. The higher the contact resistance in the device, the higher the proportion of the applied voltage is dropped across the source and drain contacts and, as a result, the lower the bias across the channel region is achieved. A high contact resistance has the effect of a much lower current level being extracted from the device due to the lower bias applied across the channel region, and hence lower device mobility.

In the following, the invention will be further illustrated on the basis of examples.

EXAMPLES

Device Characterisation:
AFM was carried out using a Veeco Nanoscope apparatus.
The produced devices were measured in ambient conditions (no device encapsulation was used) using a Hewlett Packard 4156C semiconductor parameter analyser by measuring output and transfer device characteristics. Device mobility was calculated from the transfer data in the saturation regime. The mobility is a measure of how much current is delivered through the device, and it does not necessarily refer to the intrinsic mobility of the semiconductor material itself (although in many instances this is true). For example, a device with the same mobility of material in the channel region may exhibit a higher contact resistance as compared to another device, therefore exhibiting a lower "device" mobility.

Comparative Example 1

An organic device was produced wherein the semiconductor layer comprised a blend of the following IDT-BT polymer and the following non-polymeric semiconductor compound:

$R = C_{16}H_{33}$

The semiconductor layer was produced using a 25%:75% mass ratio between the semiconductor compound and the polymer, respectively, with a total solids content of 12 mg per 1 ml solvent (o-xylene).

Figure 3:
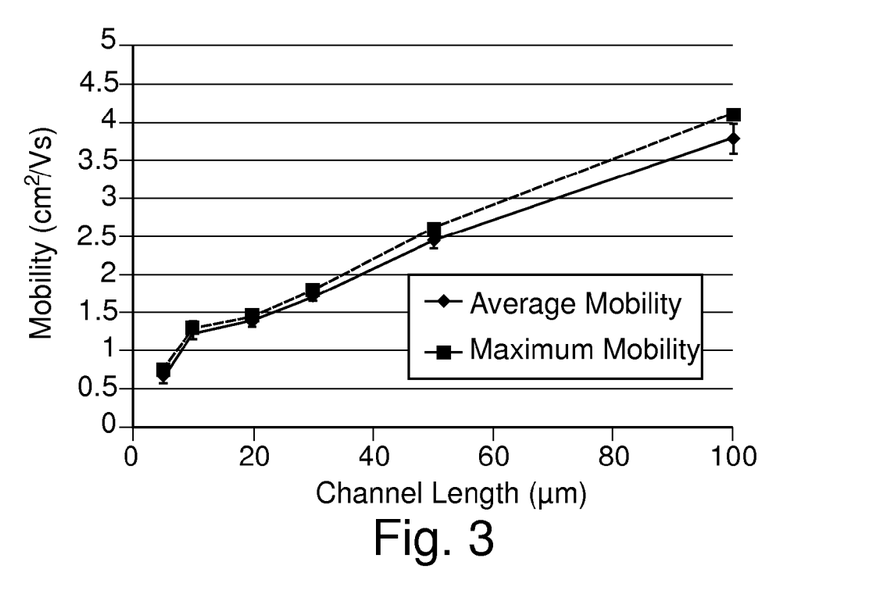
FIG. 3 illustrates the measured mobility of the device of Comparative Example 1.

The measured mobility device data for said blend is illustrated in FIG. 3.

Comparative Example 2

An organic device was produced wherein the semiconductor layer comprised a blend of the following polymer and the following non-polymeric semiconductor compound:

The semiconductor layer of the organic device was produced using a 25%:75% mass ratio between the semiconductor compound and the polymer, respectively, with a total solids content of 12 mg per 1 ml solvent (o-xylene).

Figure 4:
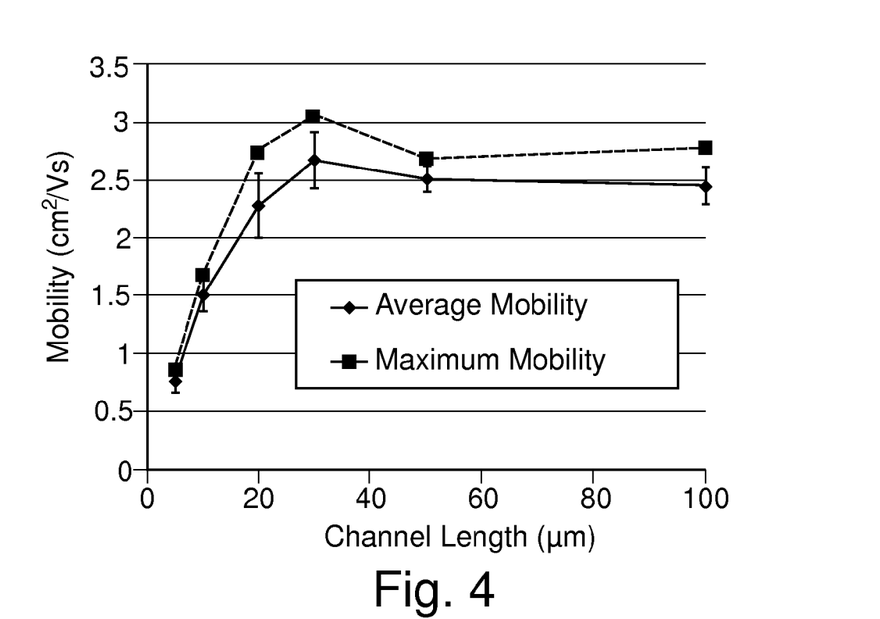
FIG. 4 illustrates the measured mobility of the device of Comparative Example 2.

The measured mobility device data for said blend is illustrated in FIG. 4.

Example 1

An organic device was produced comprising a mixture of the following different polymers and the following non-polymeric semiconductor material:

The semiconductor layer of the organic device was produced comprised 25% semiconductor compound, 37.5% fluorene-amine co-polymer and 37.5% IDT-BT polymer.

Figure 5:
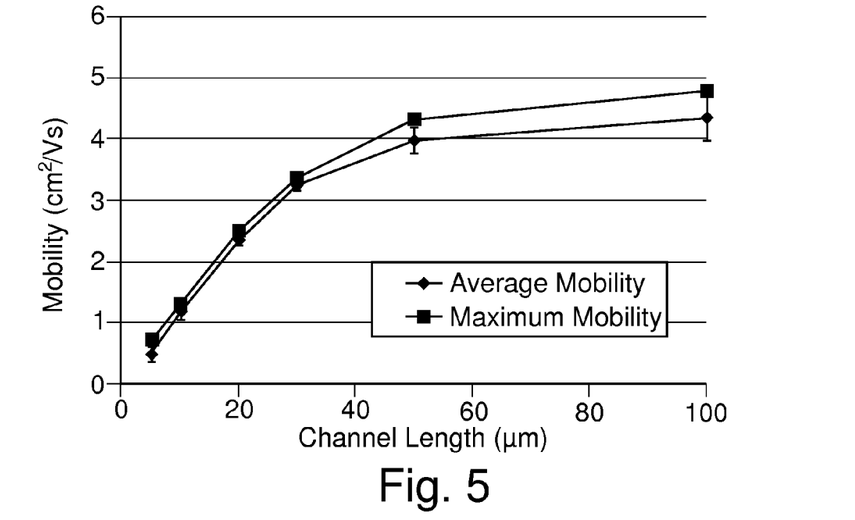
FIG. 5 illustrates the measured mobility of the device of Example 1.

The measured device data for the blend comprising a combination of polymers and a semiconductor compound is shown in FIG. 5.

As may be seen from a comparison of the results obtained for the devices of Comparative Examples 1, 2 and Example 1, the mobility, dependent from the channel length, is greatly improved in case of the polymer blend in accordance with the present invention. While the mobility slightly increases with the channel length in case of the blend of Comparative Example 1 and reaches 2 cm$^2$/Vs at a channel length of about 40 micrometer, the mobility increase is lower than the increase in case of the device of Example 1. In the case of Comparative Example 2, the mobility at small channel length increases much faster as compared to Comparative Example 1, but also peaks at a channel length of about 30 micrometer and even slightly decreases with increasing channel length. In case of the device of Example 1 in accordance with the present invention, the mobility increases faster as compared to Comparative Examples 1 and 2 at all channel length and does not peak, unlike the results obtained for Comparative Example 2.

As may be further seen from a comparison of the results of the devices of Comparative Examples 1, 2 and Example 1, contact resistance is improved through the use of an amino group containing polymer. The presence of the IDT-BT polymer gives rise to a width normalised contact resistance of 6.3 kOhm-cm, in case of the amino group containing polymer of 2.1 kOhm-cm, and in case of the polymer blend in accordance with the present invention of 3.4 k Ohm-cm. The reduction in the contact resistance is also evident in aspects such as the linearity in the output characteristics of the transistors at low drain bias when using the amino group containing polymer as part of the semiconductor formulation.

The gate bias dependent contact resistance is shown in the table below. This value is an offset parasitic resistance, comprising a combination of an interfacial resistance and an access resistance associated with the injection properties of the polymer semiconductor.

| Gate bias (V)/Contact resistance (kOhm-cm) | −20 | −30 | −40 |
|---|---|---|---|
| SM:Amine polymer | 69.2 | 10.3 | 2.1 |
| SM:IDT-BT | 51.0 | 12.1 | 6.3 |
| SM:Amine polymer:IDT-BT | 45.4 | 6.9 | 3.4 |

The mobility of the amino group containing polymer and the IDT-BT polymer are in the range of 0.003-0.005 and 0.8 to 1.2 cm2/Vs, respectively.

Figure 6A:
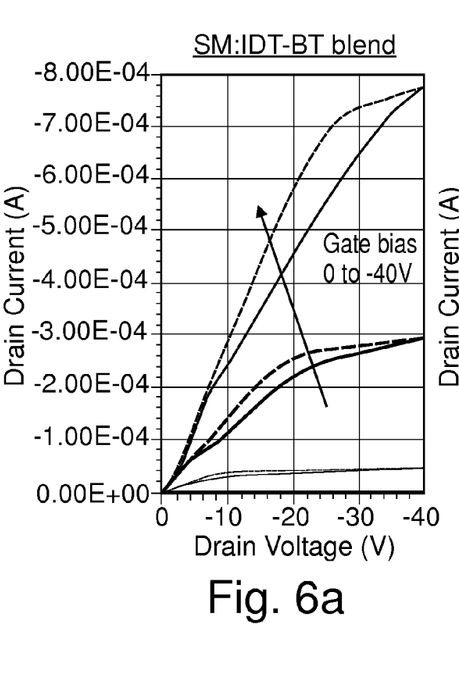
FIGS. 6a and 6b illustrate the effect on the bias stress stability due to the addition of an amine group containing polymer to the blend.
Figure 6B:
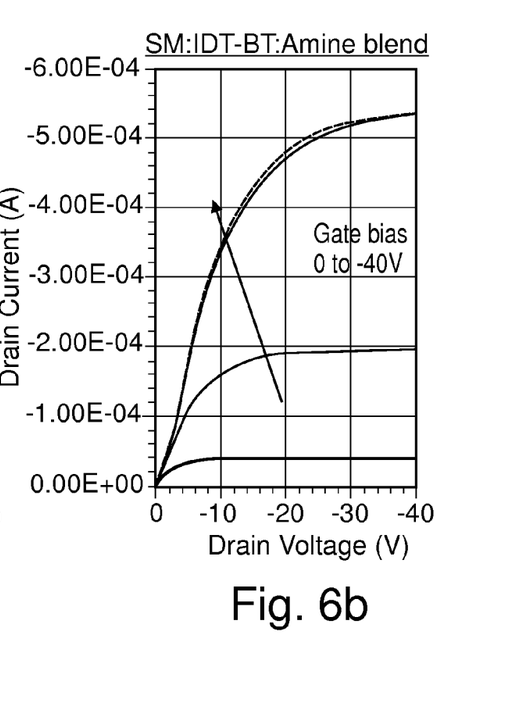

In addition to the improved mobility and linearity of the device performances when using the polymer blend in accordance with the present invention, bias stress stability is also improved through the implementation of the amine polymer, as shown in FIGS. 6a and 6b. As may be seen from FIGS. 6a and 6b, the data is based on devices with a channel length of 10 μm and width of 2 mm. In addition to the improved linearity of the output characteristics, hysteresis is also improved when using the polymer blend in accordance with the present invention. This is mostly attributed to the presence of the amino group containing polymer in the blend having an improved injection characteristic.

Figure 7A:
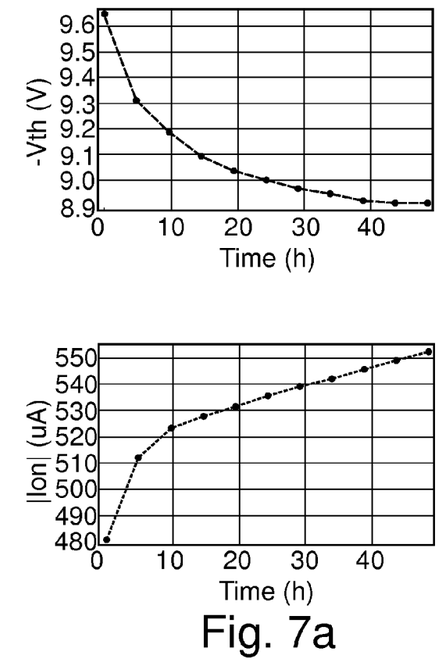
FIGS. 7a and 7b illustrate the bias stress behaviour of a 48 h stress test of devices when adding an amine group containing polymer to the blend.
Figure 7B:
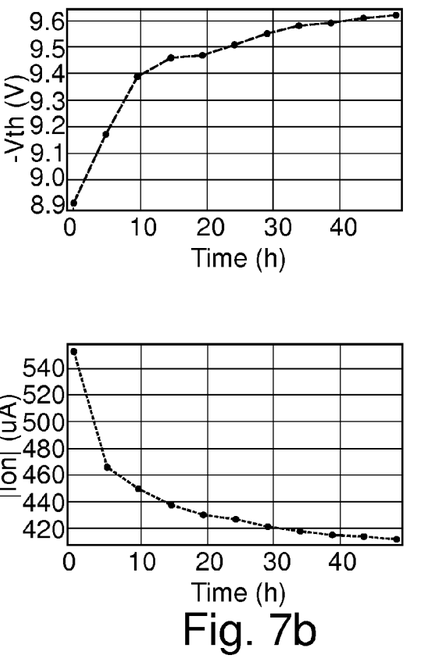

The bias stress behaviour has also been analysed for the devices comprising the blends of Comparative Examples 1, 2 and Example 1. FIGS. 7a and 7b illustrate the results from a 48 hour bias stress test taken for both, a positive gate bias stress voltage of +30V and then a negative gate bias stress of −30V. Both gate bias stress tests were conducted with 0V drain bias. Threshold voltage and corresponding on current level data from TFTs stressed with either +30V or −30V gate bias. The devices comprised 25% small molecule with 75% IDT-BT polymer as binder.

Figure 8A:
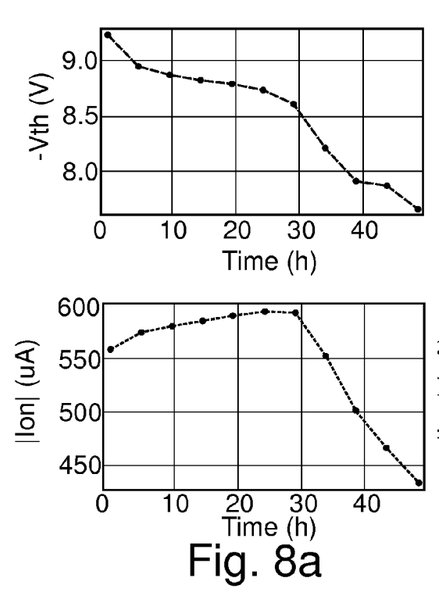
FIGS. 8a and 8b illustrate the bias stress instabilities of devices due to the addition of an amine group containing polymer to the blend.
Figure 8B:
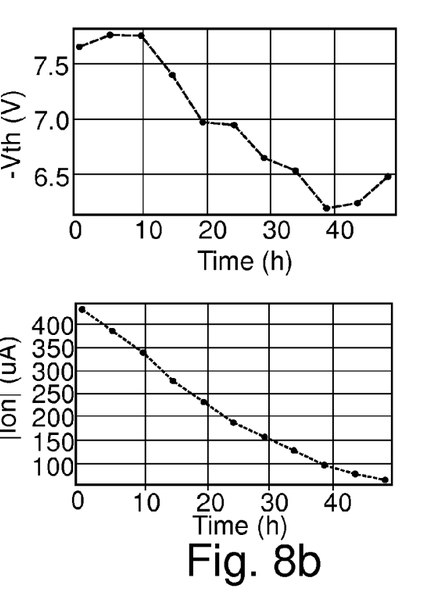

Incorporation on the amino group containing polymer to a formulation comprising 25% semiconductor compound, 37.5% amino group containing polymer and 37.5% IDT polymer exhibited bias stress instabilities as illustrated in FIGS. 8a and 8b.

Figure 9A:
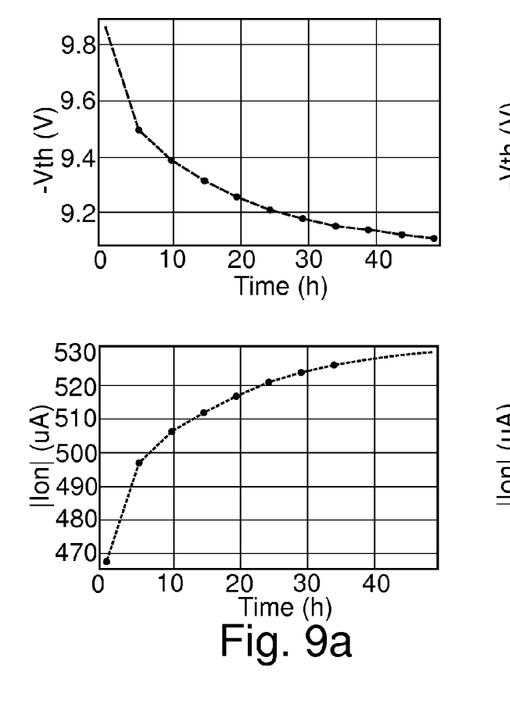
FIGS. 9a and 9b illustrate the mobility and bias stress behaviour of devices when adding different ratios of an amine group containing polymer to the blend.
Figure 9B:
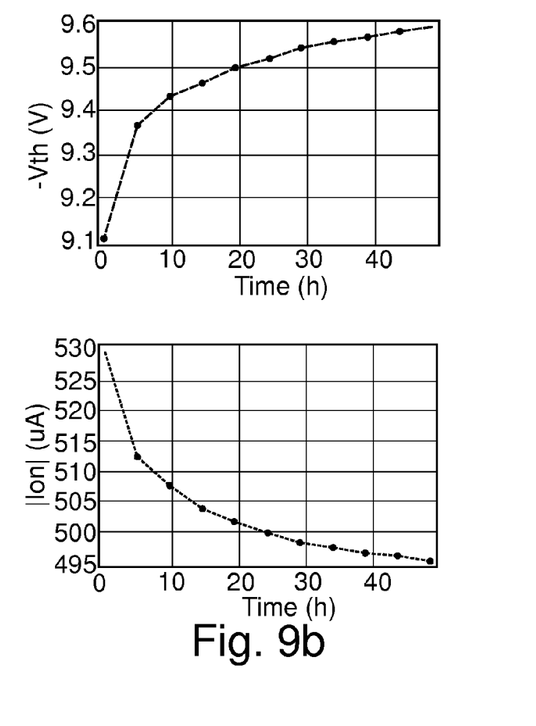

Further to the 1:1 mass ratio of the two polymers in the blend, a 2:1 mass ratio of the amine containing polymer to IDT-Bt polymer has also been tested in terms of mobility and bias stress behaviour. Bias stress data of this amine rich blend are shown in FIGS. 9a and 9b. In this formulation, the bias stress behaviour is improved in terms of a reduced shift in the threshold voltage behaviour.

Figure 10:
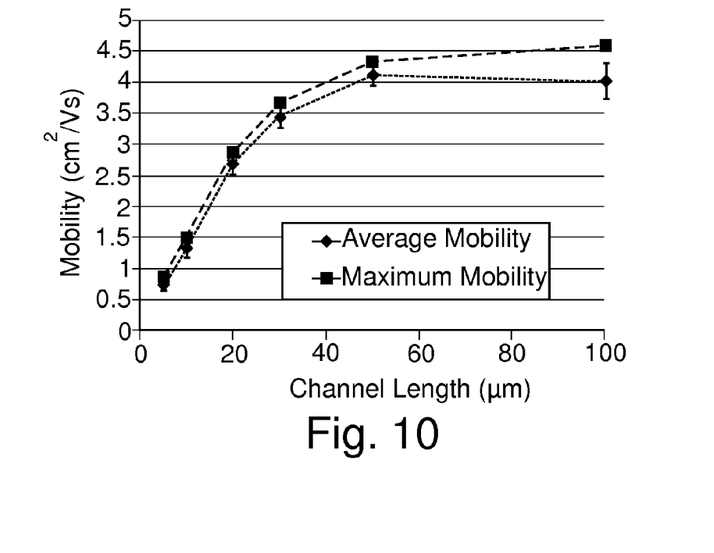
FIG. 10 illustrates the measured mobility of another device with an amine group containing polymer in the blend.

Device mobility for this amine rich blend is shown in FIG. 10, highlighting an enhanced mobility performance in comparison to the small molecule/IDT-BT blend system.

The invention claimed is:
1. A polymer blend for a semiconducting layer of an organic electronic device, comprising: a first polymer; a second polymer which is different from the first polymer; and a semiconductor compound selected from the group of pentacene derivatives and thiophene derivatives, wherein the first polymer is wherein R¹ and R² are the same or different and each is independently selected from the group consisting of hydrogen and a linear, branched or cyclic alkyl group having from 1 to 16 carbon atoms, and wherein n is an integer of 30 or more.

2. The blend of claim 1, wherein the first polymer comprises amino functional groups.

3. The blend of claim 2, wherein the first polymer comprising amino functional groups is a polyfluorene derivative.

4. The blend of claim 2, wherein the first polymer comprises the amino functional groups in the main chain of the polymer.

5. The blend of claim 1, wherein the second polymer is a polythiophene or derivative, including copolymers, thereof.

6. The blend of claim 1, wherein the second polymer is an indacenodithiophene polymer.

7. The blend of claim 1, wherein the second polymer is a copolymer of indacenodithiophene and benzothiadiazole.

8. A polymer blend for a semiconducting layer of an organic electronic device, comprising: a first polymer; a second polymer which is different from the first polymer; and a semiconductor compound selected from the group of pentacene derivatives and thiophene derivatives, wherein the second polymer is wherein R³, R⁴, R⁵ and R⁶ are the same or different and each is independently selected from the group consisting of hydrogen and a linear, branched or cyclic alkyl group having from 1 to 16 carbon atoms, and wherein m is an integer of 30 or more.

9. The blend of claim 8, wherein the semiconductor compound is a thiophene derivative.

10. The blend of claim 8, wherein the semiconductor compound is a fused thiophene derivative.

11. A polymer blend for a semiconducting layer of an organic electronic device, comprising: a first polymer; a second polymer which is different from the first polymer; and a semiconductor compound selected from the group of pentacene derivatives and thiophene derivatives, wherein the semiconductor compound is wherein R⁷ and R⁸ are the same or different and each is independently selected from the group consisting of hydrogen and a linear, branched or cyclic alkyl group having from 1 to 16 carbon atoms.

12. A composition which is a liquid at room temperature comprising: a polymer blend and organic semiconductor as claimed in claim 11, and one or more solvents.

* * * * *